(12) United States Patent
Cho et al.

(10) Patent No.: US 9,252,222 B2
(45) Date of Patent: Feb. 2, 2016

(54) TRANSISTOR AND METHOD OF FABRICATING THE SAME

(71) Applicant: ELECTRONICS AND TELECOMMUNICATIONS RESEARCH INSTITUTE, Daejeon (KR)

(72) Inventors: Sung Haeng Cho, Chungcheongbuk-do (KR); Sang-Hee Park, Daejeon (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/800,251

(22) Filed: Jul. 15, 2015

(65) Prior Publication Data

US 2015/0318363 A1 Nov. 5, 2015

Related U.S. Application Data

(62) Division of application No. 14/192,239, filed on Feb. 27, 2014, now Pat. No. 9,105,726.

(30) Foreign Application Priority Data

Jun. 14, 2013 (KR) .......................... 10-2013-0068263

(51) Int. Cl.
*H01L 29/417* (2006.01)
*H01L 29/66* (2006.01)
(Continued)

(52) U.S. Cl.
CPC ...... *H01L 29/41775* (2013.01); *H01L 29/0847* (2013.01); *H01L 29/66742* (2013.01); *H01L 29/786* (2013.01); *H01L 29/78603* (2013.01)

(58) Field of Classification Search
CPC .............. H01L 29/0847; H01L 29/786; H01L 29/41775; H01L 29/41758; H01L 29/66742; H01L 29/78603
USPC ....................................... 257/66, 401; 438/151
See application file for complete search history.

(56) References Cited

U.S. PATENT DOCUMENTS 8,836,031 B2    9/2014  Haran et al.
8,916,867 B2 *  12/2014 Koezuka .......................... 257/43
(Continued)

FOREIGN PATENT DOCUMENTS

KR          10-0454186 B1    10/2004
KR       10-2011-0058076 A    6/2011

OTHER PUBLICATIONS

Dong Han Kang et al., "Self-Aligned Coplanar a-IGZO TFTs and Application to High-Speed Circuits", IEEE Electron Device Letters, vol. 32, No. 10, pp. 1385-1387, Oct. 2011.
(Continued)

*Primary Examiner* — Allan R Wilson
(74) *Attorney, Agent, or Firm* — Rabin & Berdo, P.C.

(57) ABSTRACT

Provided is a transistor. The transistor includes: a substrate; a semiconductor layer provided on the substrate and having one side vertical to the substrate and the other side facing the one side; a first electrode extending along the substrate and contacting the one side of the semiconductor layer; a second electrode extending along the substrate and contacting the other side of the semiconductor layer; a conductive wire disposed on the first electrode and spaced from the second electrode; a gate electrode provided on the semiconductor layer; and a gate insulating layer disposed between the semiconductor layer and the gate electrode, wherein the semiconductor layer, the first electrode, and the second electrode have a coplanar.

6 Claims, 6 Drawing Sheets

(51) Int. Cl.
*H01L 29/08* (2006.01)
*H01L 29/786* (2006.01)

(56) References Cited

U.S. PATENT DOCUMENTS

| | | | |
|---|---|---|---|
| 9,130,041 B2* | 9/2015 | Yamazaki | H01L 27/1225 257/43 |
| 2005/0087804 A1 | 4/2005 | Furukawa | |
| 2012/0187395 A1 | 7/2012 | Koezuka | |
| 2013/0126860 A1 | 5/2013 | Fukuda et al. | |
| 2014/0106502 A1 | 4/2014 | Tezuka et al. | |
| 2015/0123127 A1* | 5/2015 | Yamazaki | H01L 29/66969 257/43 |
| 2015/0137124 A1* | 5/2015 | Egi | H01L 29/78693 257/43 |

OTHER PUBLICATIONS

Narihiro Morosawa et al., "A Novel Self-Aligned Top-Gate Oxide TFT for AM-OLED Displays", Symposium Digest of society of Information Display, pp. 479-482, 2011.

* cited by examiner

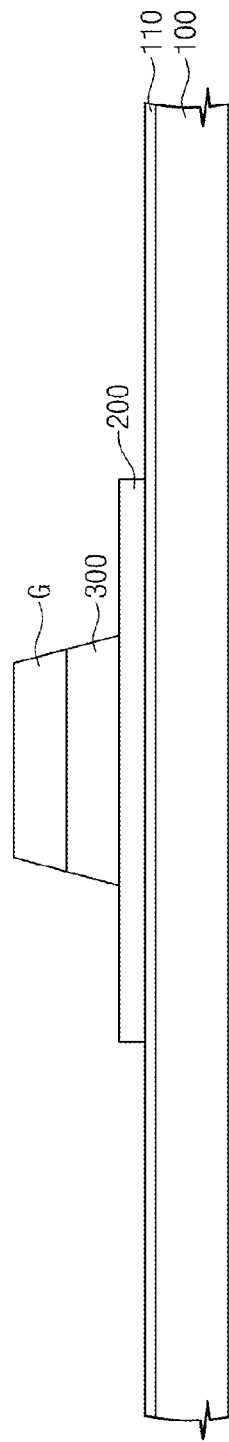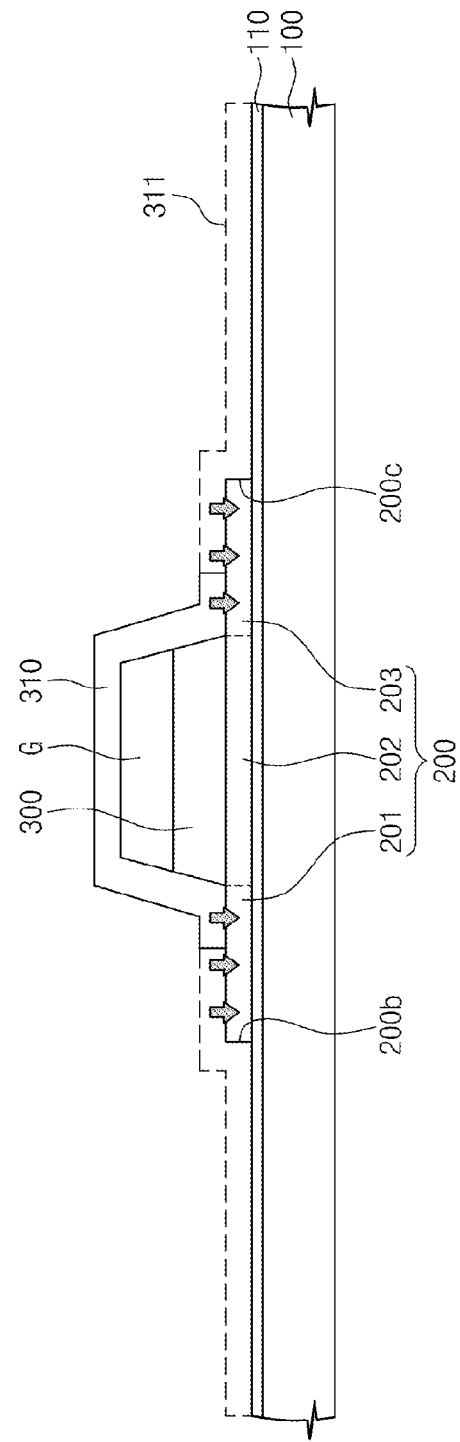

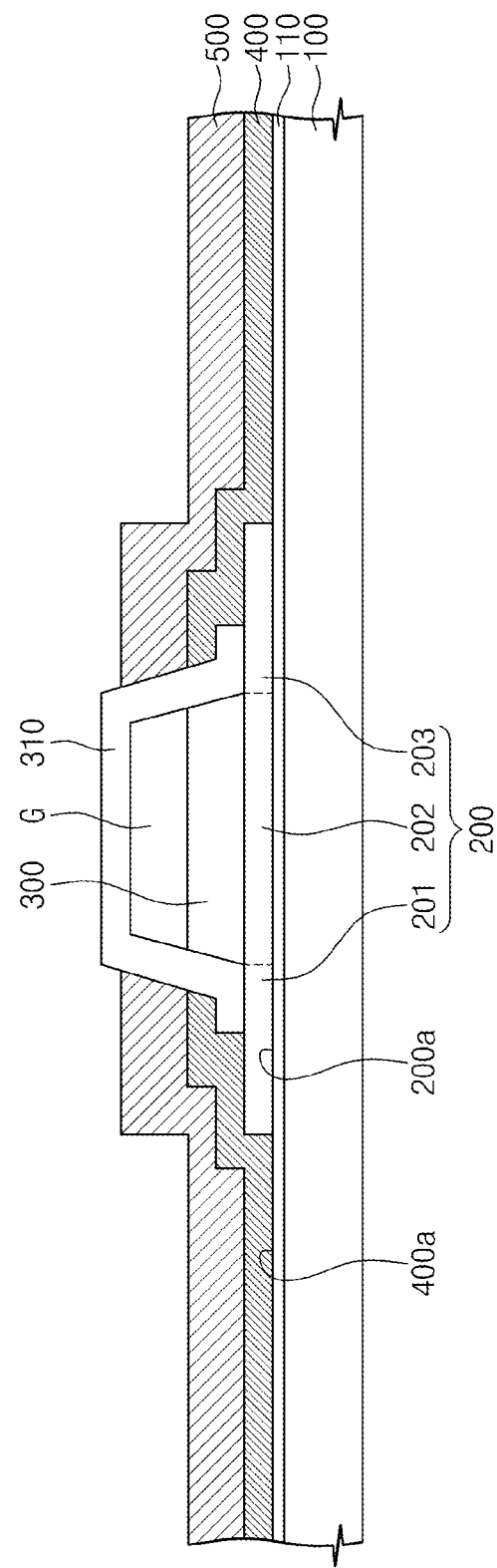

TRANSISTOR AND METHOD OF FABRICATING THE SAME

CROSS-REFERENCE TO RELATED APPLICATIONS

This is a division of application Ser. No. 14/192,239, filed Feb. 27, 2014. Furthermore, this application is based on and claims priority under 35 U.S.C. §119 of Korean Patent Application No. 10-2013-0068263, filed on Jun. 14, 2013. The entire contents of these prior applications are incorporated herein by reference.

BACKGROUND OF THE INVENTION

The present invention disclosed herein relates to a transistor, and more particularly, to a self-alignment transistor and a method of fabricating the same.

Transistors are widely used in various electronic device fields for a variety of purposes. For example, transistors are used as switching devices, driving devices, photo sensing devices, and other various components of electronic circuits. Transistors are classified into top gate structure transistors and bottom gate structure transistors. In the top gate structure, a source/drain electrode and a semiconductor layer is at the bottom and a gate insulating layer and a gate electrode are disposed thereon.

Transistors typically have a structure in which a source/drain overlaps a gate partially. In this case, parasitic capacitance occurs at a portion where the source/drain overlaps the gate, thereby slowing down operating speed.

SUMMARY OF THE INVENTION

The present invention provides a transistor having improved electronic characteristic and reliability with reduced parasitic capacitance.

The present invention also provides a method of fabricating a well arranged transistor.

Embodiments of the present invention provide transistors including: a substrate; a semiconductor layer provided on the substrate and having one side vertical to the substrate and the other side facing the one side; a first electrode extending along the substrate and contacting the one side of the semiconductor layer; a second electrode extending along the substrate and contacting the other side of the semiconductor layer; a conductive wire disposed on the first electrode and spaced from the second electrode; a gate electrode provided on the semiconductor layer; and a gate insulating layer disposed between the semiconductor layer and the gate electrode, wherein the semiconductor layer, the first electrode, and the second electrode have a coplanar.

In some embodiments, a bottom of the semiconductor layer may have the same level as a lowermost surface of the first electrode and a lowermost surface of the second electrode.

In other embodiments, the first electrode may be disposed at a position facing the second electrode and may have a symmetric form to the second electrode.

In still other embodiments, the first electrode may include the same material as the second electrode.

In even other embodiments, the transistors may further include an interlayer insulating layer provided on the semiconductor layer and covering the gate electrode, wherein the interlayer insulating layer may expose the one side and the other side of the semiconductor layer.

In yet other embodiments, the first electrode may be disposed closer to the interlayer insulating layer than the conductive line.

In further embodiments, the semiconductor layer may include a source region, a drain region, and a channel region, wherein one of the source region and the drain region may extend from the one side and the other one may extend from the other side, and the channel region may be disposed between the source region and the drain region.

In still further embodiments, the transistor may further include a passivation layer covering the conductive line, the first electrode, the second electrode, and the gate electrode.

In other embodiments of the present invention, methods of fabricating a transistor include: providing a substrate including a semiconductor layer; forming a gate insulating layer and a gate electrode at a position corresponding to a core of the semiconductor layer; forming an interlayer insulating layer covering the gate electrode and exposing both sides of the semiconductor layer; forming an electrode layer extending along the substrate and contacting the both sides of the semiconductor layer; forming a conductive layer covering the electrode layer; forming a first electrode and a second electrode spaced from the first electrode by patterning the electrode layer; and forming a conductive line on the first electrode by removing the conductive layer on the second electrode, wherein the first electrode contacts one side of the semiconductor layer and the second electrode contacts the other side of the semiconductor layer and has a coplanar with the semiconductor layer and the first electrode.

In some embodiments, a lowermost surface of the electrode layer may have the same level as a bottom of the semiconductor layer.

In other embodiments, the first electrode may have a symmetric form to the second electrode.

In still other embodiments, the patterning of the electrode layer may include removing the electrode layer on a position corresponding to the gate electrode.

In even other embodiments, the forming of the interlayer insulating layer may include: forming an insulating layer covering the substrate, the semiconductor layer, and the gate electrode; forming a channel region, a source region, and drain region on the semiconductor layer by thermally-treating the insulating layer; and removing a portion of the insulating layer to expose the source region and the drain region, wherein one of the source region and the drain region may extend from the one side of the semiconductor layer and the other one may extend from the other side of the semiconductor layer, and the channel region may be disposed between the source region and the drain region.

In yet other embodiments, the methods may further include: forming a passivation layer covering the conductive line, the interlayer insulating layer, and the second electrode; and partially exposing the conductive line by forming an opening penetrating the passivation layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 2 to 7 are sectional views illustrating a manufacturing process of a transistor according to an embodiment of the present invention. Redundant description is omitted.

DETAILED DESCRIPTION OF PREFERRED EMBODIMENTS

Figure 1:
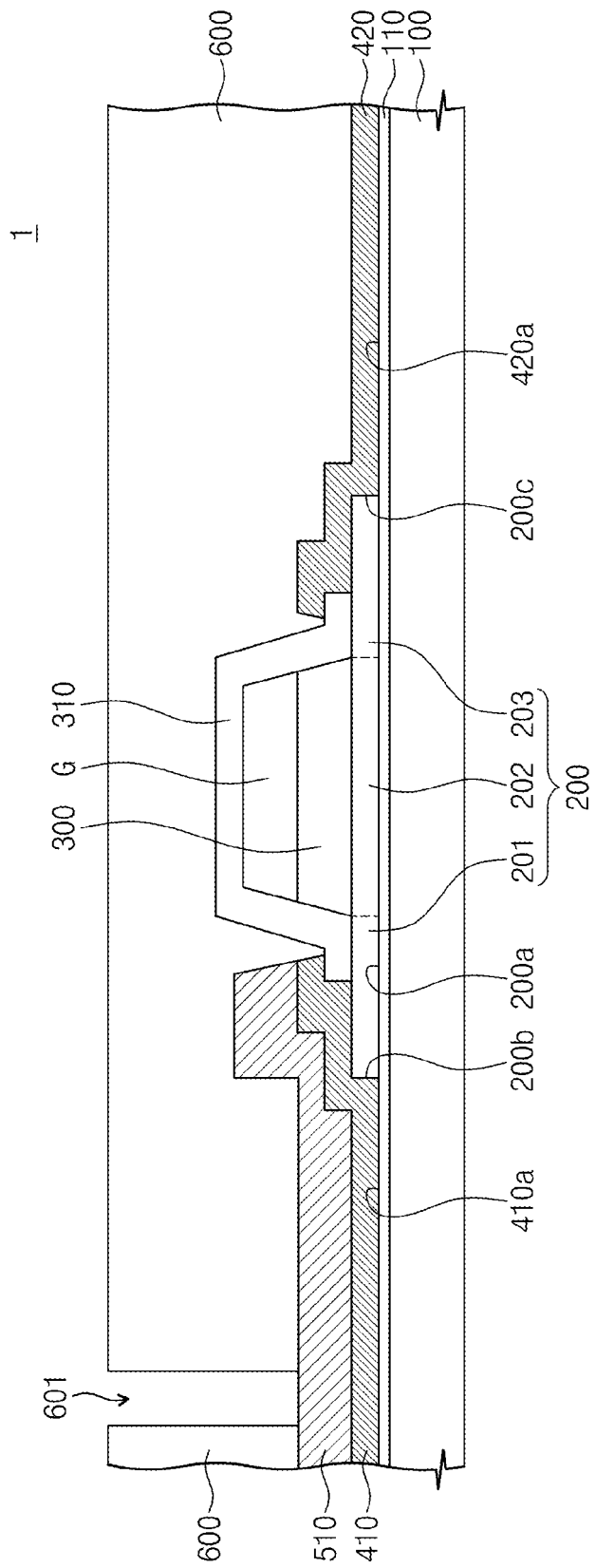
FIG. 1 is a sectional view illustrating a transistor according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present.

Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof.

Unless otherwise defined herein, terms used in embodiments of the present invention should be interpreted as general meanings to those skilled in the art.

Hereinafter, it will be described about an exemplary embodiment of the present invention in conjunction with the accompanying drawings.

FIG. 1 is a sectional view illustrating a transistor according to an embodiment of the present invention.

Referring to FIG. 1, the transistor 1 includes a semiconductor layer 200, a gate insulating layer 300, a gate electrode G, an interlayer insulating layer 310, a first electrode 410, a second electrode 420, a conductive line 510, and a passivation layer 600, on a substrate 100. The transistor 1 may be used in a display device, for example.

The semiconductor layer 200 may be provided on the substrate 100. The substrate 100 may include an insulating material, for example, glass or plastic. The buffer layer 110 may cover the substrate 100. As another example, the semiconductor layer 200 may have a bottom surface 200a, one side 200b, and the other side 200c. The bottom surface 200a may face the substrate 100. The one side 200b and the other side 200c may be perpendicular to the bottom surface 200a and may face each other. The semiconductor layer 200 may include a source and drain regions 201, 203 spaced from each other, and a channel region 202 disposed between the source and drain regions 201, 203. One of the source and drain regions 201, 203 may extend from the one side 200b and the other one may extend from the other side 200c. The source and drain regions 201, 203 do not overlap the channel region 202, so that parasitic resistance may not occur while the transistor 1 operates. The semiconductor layer 200 may include an oxide semiconductor including at least one of Al, Zn, In, Sn, and Ga. As another example, the semiconductor layer 200 may include silicon material.

The gate insulating layer 300 may be provided on the semiconductor layer 200 and may cover the channel region 202.

The gate electrode G may be disposed on the gate insulating layer 300. The gate insulating layer 300 may be provided at a position that vertically corresponding to the channel region 202. The gate electrode G may include conductive material.

The interlayer insulating layer 310 may cover the substrate 100, the gate insulating layer 300, and the gate electrode G. The interlayer insulating layer 310 may expose the both sides 200b and 200c, for example, the source and drain regions 201, 203, for example. The interlayer insulating layer 310 may include hydrogen.

The first electrode 410 and the second electrode 420 may be provided on the substrate 100, and may extend along the substrate 100. The first electrode 410 may be disposed between the semiconductor layer 200 and the conductive line 510, and may contact the one side 200b of the semiconductor layer 200. The second electrode 420 may contact the other side 200c. The second electrode 420 may serve as a pixel electrode. The first electrode 410 may be electrically connected to one of the source and drain regions 201, 203, and the second electrode 420 may be electrically connected to the other one. Accordingly, a contact hole (not shown) connecting the second electrode 420 to the semiconductor layer 200 may be omitted. The transistor 1 may have an improved aperture ratio of the second electrode 420 compared to when the transistor 1 includes a contact hole. The bottom surface 200a of the semiconductor layer 200 may have a coplanar with the lowermost surface 410a of the first electrode 410 and the lowermost surface 420a of the second electrode 420. That is, the bottom 200a of the semiconductor layer 200 has the same level as the lowermost surface 410a of the first electrode 410 and the lowermost surface 420a of the second electrode 420, so that it may parallel to each other. The second electrode 420 may be provided to a position that is laterally symmetric to the first electrode 410, and may have a symmetric form to the first electrode 410. The first electrode 410 and the second electrode 420 may be aligned well.

The second electrode 420 may be spaced from the conductive line 510. When the second electrode 420 does not have a coplanar with the semiconductor layer 200 and is electrically connected to the semiconductor layer 200 on the passivation layer 600 through a contact hole, it may overlap the conductive line 510 vertically. In this case, parasitic capacitance may occur between the second electrode 420 and the conductive line 510. The transistor 1 may further reduce parasitic capacitance compared to when the second electrode 420 overlaps the conductive line 510. The second electrode 420 may show uniform voltage distribution. As the interlayer insulating layer 310 is interposed between the first and second electrodes 410 and 420 and the gate electrode G, electrical short may be prevented between the first and second electrodes 410 and 420 and the gate electrode G.

The second electrode 420 may have the same material as the first electrode. The first electrode 410 and the second electrode 420 may include conductive material. For example, the first electrode 410 and the second electrode 420 may include metallic materials such as Mo, Ti, Ta, MoTi, and MoTa, or transparent conductive oxides such as ITO, IZO, AZO, GZO, and ZITO.

The conductive line 510 may be disposed on the first electrode 410. The conductive line 510 may be electrically connected to the semiconductor layer 200 through the first electrode 410. As a contact hole electrically connecting the conductive line 510 to the semiconductor layer 200 is omitted, the conductive line 510 may be spaced from the second electrode 420. The conductive line 510 may include a conductive material having a resistance of less than 3 μΩcm. For example, the conductive line 510 may include Cu, Ag, or an alloy thereof. As another example, the conductive line 510 may have a multi-layer structure of Mo/Al/Mo. The conductive line 510 may be further spaced from the interlayer insulating layer 310 than the first electrode 410. The first electrode 410 may attaches the conductive line 510 on the semiconductor layer 200 and/or the substrate 100 well. The first electrode 410 may prevent a material in the conductive line 510 from diffusing into the semiconductor layer 200.

The passivation layer 600 may be provided on the substrate 100 to cover the conductive line 510, the first electrode 410, the interlayer insulating layer 310, and the second electrode 420. The passivation layer 600 may include insulating material. The passivation layer 600 may have an opening 601 penetrating thereinto to expose the conductive line 510.

FIGS. 2 to 7 are sectional views illustrating a manufacturing process of a transistor according to an embodiment of the present invention. Redundant description is omitted.

Referring to FIG. 2, a semiconductor layer 200, a gate insulating layer 300, and a gate electrode G may be sequentially formed on the substrate 100. For example, the substrate 100 having a buffer layer 110 may be provided. As another example, the formation of the buffer layer 110 may be omitted. The semiconductor layer 200 may be formed on the substrate 100. A gate insulating layer 300 may be formed at a position corresponding to a core of the semiconductor layer 200. The gate electrode G may cover the top surface of the gate insulating layer 300. The substrate 100, the semiconductor layer 200, the gate insulating layer 300, and the gate electrode G may be the same or similar to those described with reference to FIG. 1.

Referring to FIG. 3, the interlayer insulating layer 310 may be formed on the substrate 100. For example, an insulating layer 311 may include hydrogen. The semiconductor layer 200 and the insulating layer 311 may be thermally treated at a temperature condition of more than about 300° C. The semiconductor layer 200 may be annealed by the thermal treatment. Hydrogen in the insulating layer 311 diffuses into the semiconductor layer 200 through thermal treatment, so that the electron density of the semiconductor layer 200 contacting the insulating layer 311 may be increased. Accordingly, a source and drain regions 201, 203 may be formed in the semiconductor layer 200. The semiconductor layer 200 that does not contact the insulating layer 311 has a lower electron density than the source and drain regions 201, 203, so that it may serve as a channel region 202. By removing the insulating layer 311 to expose the source and drain regions 201, 203 partially, the interlayer insulating layer 310 may be formed. At this point, the insulating layer 311 contacting the substrate 100 and/or the buffer layer 110 may be removed. The interlayer insulating layer 310 may expose the both sides 200b and 200c of the semiconductor layer 200.

Referring to FIG. 4, an electrode layer 400 and a conductive layer 500 are sequentially formed on the substrate 100 so as to cover the semiconductor layer 200 and the interlayer insulating layer 310. For example, the electrode layer 400 may extend along the substrate 100 and may be parallel to the semiconductor layer 200. The lowermost surface 400a of the electrode layer 400 may have the same level as the bottom surface 200a of the semiconductor layer 200. The electrode layer 400 may include metallic materials such as Mo, Ti, Ta, MoTi, and MoTa, or transparent conductive oxides such as ITO, IZO, AZO, GZO, and ZITO. The conductive layer 500 may be deposited on the electrode layer 400 to cover the electrode layer 400. The conductive layer 500 may include a conductive material having a low resistance (for example, a resistance of less than 3 μΩcm). The conductive layer 500 may have a higher etch selectivity than the electrode layer 400. For example, when the electrode layer 400 includes ITO, the conductive layer 500 may be formed to have a multi-layer structure of Mo/Al/Mo. As another example, when the electrode layer 400 includes Mo, Ti, MoTi, MoTa, IZO, AZO, or GZO, the conductive layer 500 may include Cu.

Figure 5:
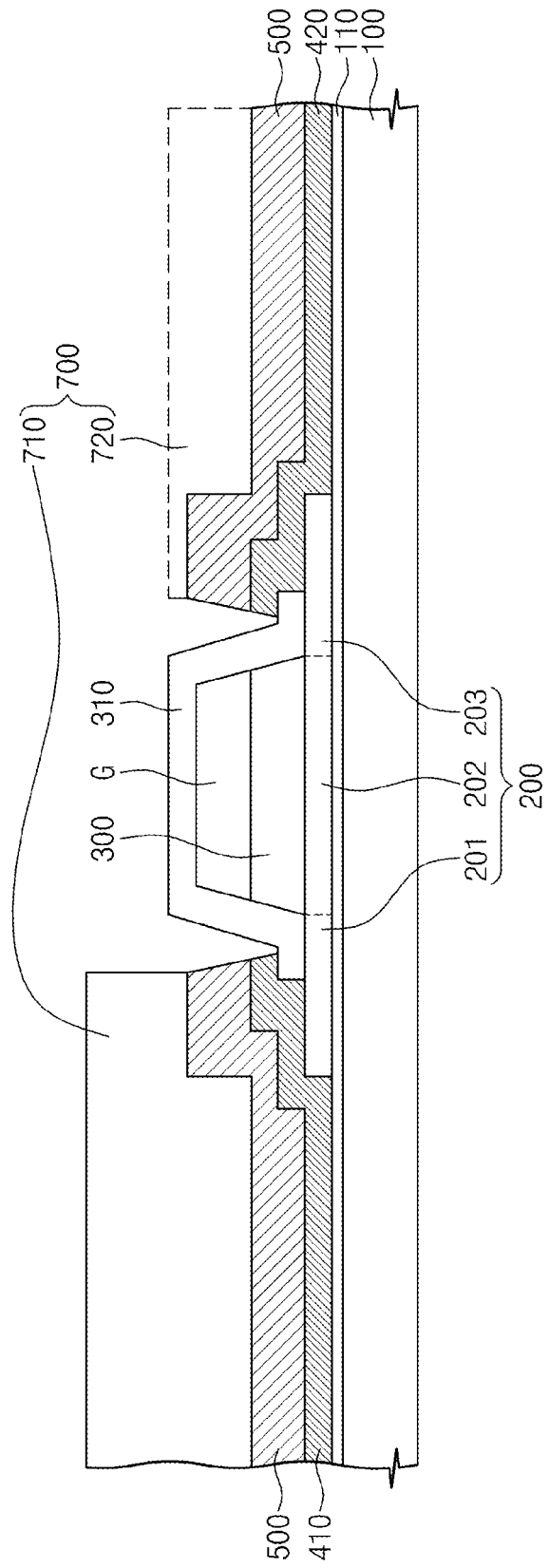

Referring to FIG. 5, a portion of the electrode layer 400 of FIG. 5 is removed, so that the first electrode 410 and the second electrode 420 may be formed. For example, a half-tone mask 700 may be formed on the conductive layer 500. The half-tone mask 700 may include a first mask 710 on the first electrode 410 and a second mask 720 on the second electrode 420. By adjusting the area exposed to light and its intensity during an exposure process, the first mask 710 may be formed to be thicker than the second mask 720. The electrode layer 400 of FIG. 4 at the position vertically corresponding to the gate electrode G is removed by using an etching process using the half-tone mask, so that the first electrode 410 and the second electrode 420 may be formed. At this point, a portion of the conductive layer 500 may be removed together. The first electrode 410 and the second electrode 420 may be the same or identical to those described with reference to FIG. 1. According to a method of manufacturing the transistor 1, the first electrode 410 and the second electrode 420 may be formed to have a coplanar with the semiconductor layer 200 and contact the semiconductor player 200, so that a formation process for contact hole for electrical connection of the second electrode 420 may be omitted. Accordingly, compared to when the second electrode 420 is formed on the passivation layer 600 to have a contact hole, the transistor 1 may be easily formed. Furthermore, misalignment of the first electrode 410 and the second electrode 420 occurring during a contact hole formation process may be prevented. As the second mask 720 is removed, the second electrode 420 may be exposed. For example, the second mask 720 may be removed by an etching process. At this point, since the first mask 710 is thicker than the second mask 720, it may not be removed.

Figure 6:
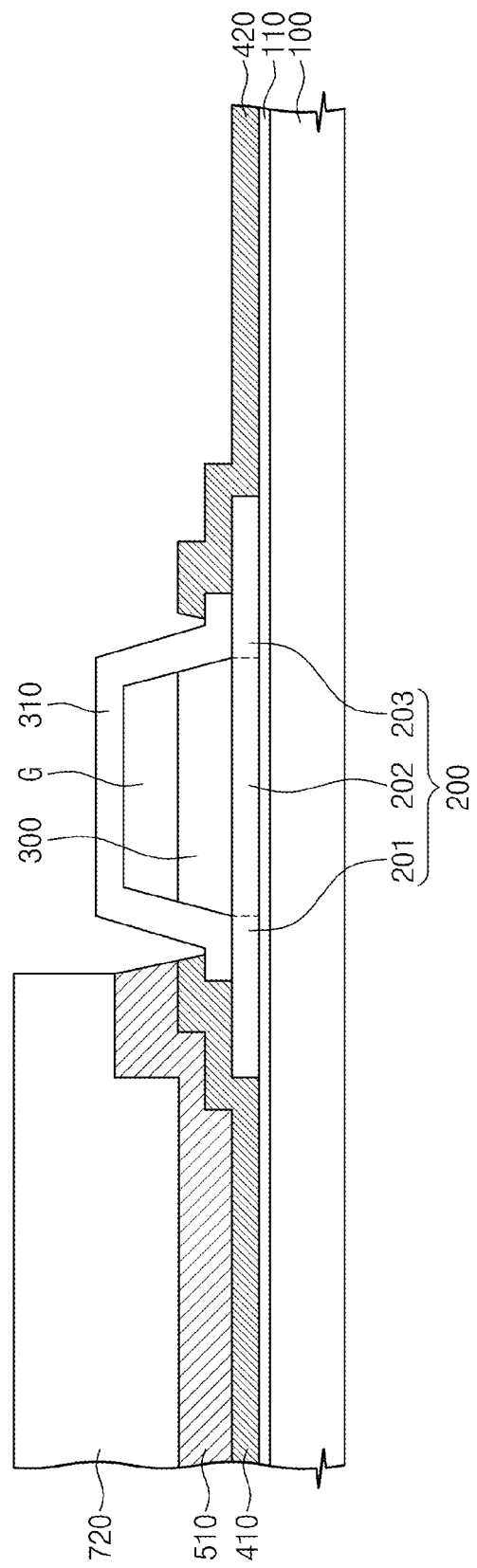

Referring to FIG. 6, wherein the conductive line 510 is formed to cover a portion of the first electrode 410. For example, the conductive layer 500 of FIG. 5 is etched by using the first mask 710 so that the conductive layer 500 of FIG. 5 on the second electrode 420 may be removed. The first electrode 410 and the second electrode 420 may not be removed because they have a lower etch rate than the conductive layer 500 of FIG. 5. The conductive line 410 may be further spaced from the interlayer insulating layer 310 than the first electrode 410. For example, by adjusting the position at which the first mask 710 is formed, the position at which the conductive line 510 is formed may be controlled. By removing the first mask 710, the conductive line 510 may be exposed. As the conductive line 510 contacts the first electrode 410, the formation of a contact hole for electrical connection with the first electrode 410 may be omitted. The transistor 1 may be easily fabricated compared to when the conductive line 510 is vertically spaced from the first electrode 410.

Figure 7:
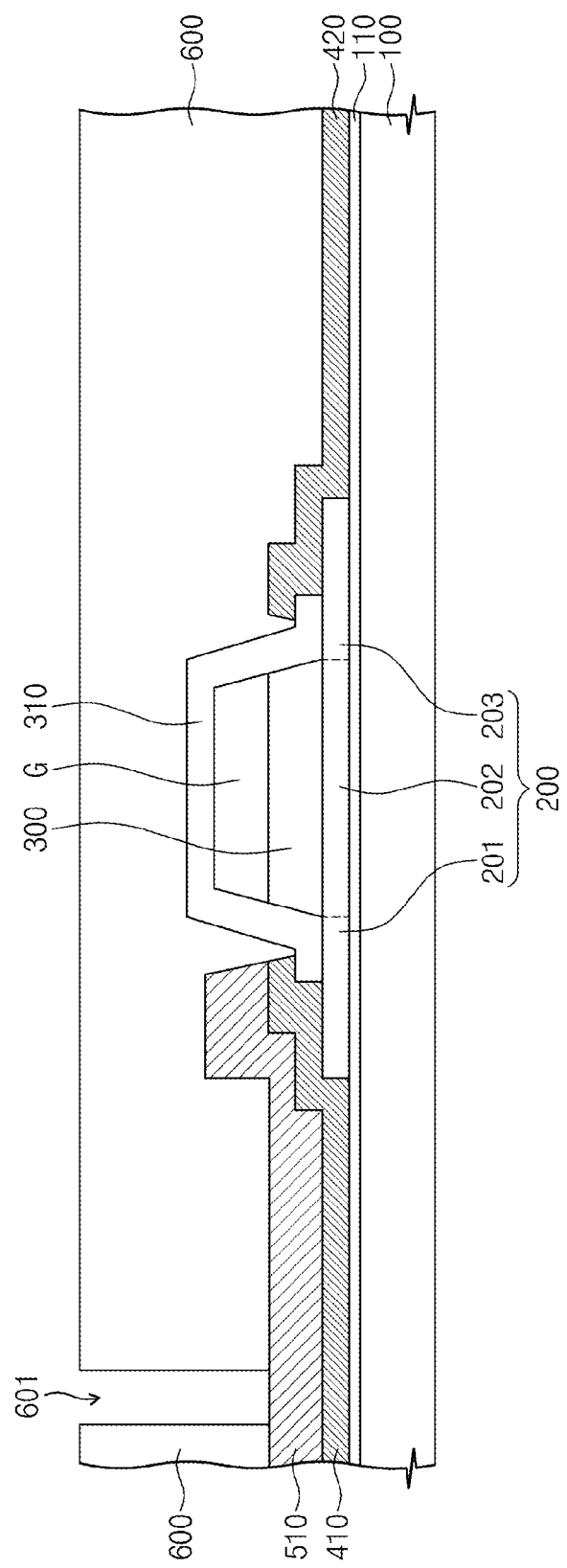

Referring to FIG. 7, a passivation layer 600 having an opening 601 is formed so that it may cover the conductive line 510, the first electrode 410, the interlayer insulating layer 310, and the second electrode 420. For example, by coating an insulating material on the substrate 100, the passivation layer 600 may be formed. By forming an opening 601 penetrating the passivation layer 600, a portion of the first electrode 410 may be exposed. According to the above-mentioned embodiments, the transistor 1 of FIG. 1 may be fabricated completely.

According to embodiments of the present invention, a semiconductor layer, a first electrode, and a second electrode may have a coplanar. A conductive line may be spaced from the second electrode. Voltage may be distributed in the second electrode uniformly. A transistor according to an embodiment of the present invention may further reduce parasitic capacitance, compared to when the conductive line overlaps the second electrode. The first electrode may be provided at a position that is horizontally corresponding to the second electrode, and may be aligned well with a symmetric form. The transistor may have improved electrical characteristics.

As the first electrode and the second electrode are formed parallel to the semiconductor layer, a contact hole formation process may be omitted. The transistor may be easily manufactured compared to when the first electrode, the second electrode, and the conductive line are electrically connected to the semiconductor layer through a contact hole.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of fabricating a transistor, the method comprising:

providing a substrate including a semiconductor layer;

forming a gate insulating layer and a gate electrode at a position corresponding to a core of the semiconductor layer;

forming an interlayer insulating layer covering the gate electrode and exposing both sides of the semiconductor layer;

forming an electrode layer extending along the substrate and contacting the both sides of the semiconductor layer;

forming a conductive layer covering the electrode layer;

forming a first electrode and a second electrode spaced from the first electrode by patterning the electrode layer; and forming a conductive line on the first electrode by removing the conductive layer on the second electrode, wherein the first electrode contacts one side of the semiconductor layer and the second electrode contacts the other side of the semiconductor layer; and the semiconductor layer, the first electrode, and the second electrode have a coplanar level surface.

2. The method of claim 1, wherein a lowermost surface of the electrode layer adjacent the substrate has the same level as a bottom surface of the semiconductor layer adjacent the substrate.

3. The method of claim 1, wherein the first electrode has a symmetric form to the second electrode.

4. The method of claim 1, wherein the patterning of the electrode layer comprises removing the electrode layer on a position corresponding to the gate electrode.

5. The method of claim 1, wherein the forming of the interlayer insulating layer comprises:

forming an insulating layer covering the substrate, the semiconductor layer, and the gate electrode;

forming a channel region, a source region, and a drain region on the semiconductor layer by thermally-treating the insulating layer; and removing a portion of the insulating layer to expose the source region and the drain region, wherein one of the source region and the drain region extends from the one side of the semiconductor layer and the other one extends from the other side of the semiconductor layer, and the channel region is disposed between the source region and the drain region.

6. The method of claim 1, further comprising:

forming a passivation layer covering the conductive line, the interlayer insulating layer, and the second electrode; and partially exposing the conductive line by forming an opening penetrating the passivation layer.

* * * * *